US009986667B2

(12) United States Patent
Nikkhoo et al.

(10) Patent No.: US 9,986,667 B2
(45) Date of Patent: *May 29, 2018

(54) FLEXIBLE THERMAL CONDUIT FOR AN ELECTRONIC DEVICE

(71) Applicant: Microsoft Technology Licensing, LLC, Redmond, WA (US)

(72) Inventors: Michael Nikkhoo, Saratoga, CA (US); Doug Heirich, Palo Alto, CA (US); Roy Riccomini, Saratoga, CA (US); Maosheng Ye, San Jose, CA (US); Michael Beerman, Mill Valley, CA (US); Joseph Daniel Taylor, San Francisco, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/379,425

(22) Filed: Dec. 14, 2016

(65) Prior Publication Data

US 2017/0099749 A1 Apr. 6, 2017

Related U.S. Application Data

(63) Continuation of application No. 14/705,893, filed on May 6, 2015, now Pat. No. 9,545,030.
(Continued)

(51) Int. Cl.
*H05K 7/20* (2006.01)
*F28F 21/02* (2006.01)
(Continued)

(52) U.S. Cl.
CPC .......... *H05K 7/20963* (2013.01); *F28F 3/08* (2013.01); *F28F 21/02* (2013.01); *F28F 21/08* (2013.01);
(Continued)

(58) Field of Classification Search
CPC .................. G06F 1/163; G06F 1/1683; H04B 2001/3866
See application file for complete search history.

(56) References Cited

U.S. PATENT DOCUMENTS 4,840,225 A 6/1989 Foley et al.
5,077,637 A * 12/1991 Martorana ......... H05K 7/20545
165/185
(Continued)

FOREIGN PATENT DOCUMENTS

DE 3738897 A1 5/1989
EP 675382 A1 10/1995
(Continued)

OTHER PUBLICATIONS

"International Preliminary Report on Patentability Issued in PCT Application No. PCT/US2016/012012", dated Jun. 7, 2017, 9 Pages.
(Continued)

*Primary Examiner* — Robert J Hoffberg
(74) *Attorney, Agent, or Firm* — Arent Fox LLP

(57) ABSTRACT

A flexible thermal conduit runs from a first housing portion of an electronic device to a second housing portion of the electronic device, to convey heat generated by an electronic component located in the first housing portion to a heat dissipation structure located in the second housing portion, where the second housing portion is flexibly coupled to the first housing portion, for example, by a hinge or other type of joint. The flexible conduit may include a plurality of layers of thin, flat thermally conductive material, which may be arranged to flex independently of each other in the region where the first and second housing portions are coupled.

15 Claims, 18 Drawing Sheets

Related U.S. Application Data

(60) Provisional application No. 62/105,684, filed on Jan. 20, 2015.

(51) Int. Cl.

| | | |
|---|---|---|
| *F28F 21/08* | (2006.01) | |
| *F28F 3/08* | (2006.01) | |
| *G02B 27/01* | (2006.01) | |
| *G06F 1/16* | (2006.01) | |
| *G06F 1/20* | (2006.01) | |
| *H05K 1/02* | (2006.01) | |
| *H05K 5/02* | (2006.01) | |
| *H01L 23/373* | (2006.01) | |

(52) U.S. Cl.
CPC ......... *G02B 27/0176* (2013.01); *G06F 1/163* (2013.01); *G06F 1/203* (2013.01); *H01L 23/3733* (2013.01); *H01L 23/3735* (2013.01); *H01L 23/3736* (2013.01); *H05K 1/0201* (2013.01); *H05K 5/0226* (2013.01); *H05K 7/20409* (2013.01); *H05K 7/20454* (2013.01); *F28F 2255/02* (2013.01)

(56) References Cited

U.S. PATENT DOCUMENTS

| | | | |
|---|---|---|---|
| 5,218,516 A | 6/1993 | Collins et al. | |
| 5,276,584 A | 1/1994 | Collins et al. | |
| 5,390,734 A * | 2/1995 | Voorhes ................... | F28F 13/00 |
| | | | 165/185 |
| 5,486,652 A | 1/1996 | Kasper | |
| 5,486,841 A | 1/1996 | Hara et al. | |
| 5,546,099 A | 8/1996 | Quint et al. | |
| 5,588,300 A * | 12/1996 | Larsson ................... | F25B 21/02 |
| | | | 165/185 |
| 5,781,411 A | 7/1998 | Feenstra | |
| 5,812,224 A | 9/1998 | Maeda et al. | |
| 6,075,696 A * | 6/2000 | Progl ....................... | G06F 1/203 |
| | | | 16/226 |
| 6,229,701 B1 | 5/2001 | Kung et al. | |
| 6,324,055 B1 * | 11/2001 | Kawabe ................ | G06F 1/1616 |
| | | | 361/679.54 |
| 6,474,074 B2 | 11/2002 | Ghoshal | |
| 6,532,152 B1 | 3/2003 | White et al. | |
| 6,580,608 B1 | 6/2003 | Searls et al. | |
| 6,755,240 B2 | 6/2004 | Werninger | |
| 6,799,628 B1 | 10/2004 | Masseth et al. | |
| 6,826,047 B1 | 11/2004 | Chen et al. | |
| 7,188,484 B2 | 3/2007 | Kim | |
| 7,319,590 B1 | 1/2008 | Ingram | |
| RE40,369 E | 6/2008 | Miyahara et al. | |
| 7,457,133 B2 | 11/2008 | Chiang et al. | |
| 7,469,451 B2 * | 12/2008 | Hashizume ........... | G06F 1/1616 |
| | | | 16/225 |
| 7,596,956 B2 | 10/2009 | Lilke | |
| 7,688,586 B2 | 3/2010 | Tomioka | |
| 7,719,856 B2 | 5/2010 | Nelson et al. | |
| 7,903,405 B1 | 3/2011 | Miller et al. | |
| 8,125,075 B2 | 2/2012 | Maveety et al. | |
| 8,451,604 B2 | 5/2013 | Bhattacharya et al. | |
| 8,520,381 B2 | 8/2013 | Hobein et al. | |
| 8,611,088 B2 | 12/2013 | Barna | |
| 8,952,565 B2 | 2/2015 | Kroulik et al. | |
| 9,059,129 B2 | 6/2015 | Wavering | |
| 9,179,579 B2 * | 11/2015 | Hada ..................... | H01L 23/373 |
| 9,271,427 B2 | 2/2016 | Kilroy et al. | |
| 9,329,689 B2 | 5/2016 | Osterhout et al. | |
| 9,545,030 B2 * | 1/2017 | Nikkhoo ............. | H05K 7/20127 |
| 9,572,283 B2 * | 2/2017 | Teo ....................... | G02B 6/4266 |
| 9,585,285 B2 | 2/2017 | Nikkhoo et al. | |
| 9,791,704 B2 * | 10/2017 | Nikkhoo ............. | G02B 27/0176 |
| 2005/0168941 A1 | 8/2005 | Sokol et al. | |
| 2010/0079356 A1 | 4/2010 | Hoellwarth | |
| 2010/0167636 A1 | 7/2010 | Bhattacharya et al. | |
| 2011/0149518 A1 | 6/2011 | Salamon et al. | |
| 2012/0000627 A1 | 1/2012 | Jewell-Larsen et al. | |
| 2012/0192265 A1 | 7/2012 | Arnouse | |
| 2012/0212399 A1 | 8/2012 | Border et al. | |
| 2012/0212484 A1 | 8/2012 | Haddick et al. | |
| 2012/0235884 A1 | 9/2012 | Miller et al. | |
| 2012/0250254 A1 | 10/2012 | Kojiyo et al. | |
| 2013/0100511 A1 | 4/2013 | Yamamoto et al. | |
| 2013/0182390 A1 | 7/2013 | Teo et al. | |
| 2013/0222235 A1 | 8/2013 | Abdollahi et al. | |
| 2013/0314303 A1 | 11/2013 | Osterhout et al. | |
| 2014/0160668 A1 | 6/2014 | Heymann et al. | |
| 2015/0220122 A1 | 8/2015 | Rhee et al. | |
| 2015/0342089 A1 | 11/2015 | Kim et al. | |
| 2016/0212879 A1 | 7/2016 | Nikkhoo et al. | |

FOREIGN PATENT DOCUMENTS

| | | |
|---|---|---|
| EP | 2034520 A1 | 3/2009 |
| EP | 2327542 A1 | 6/2011 |

OTHER PUBLICATIONS

"Notice of Allowance Issued in U.S. Appl. No. 14/705,893", dated Sep. 1, 2016, 15 Pages.

"Notice of Allowance Issued in U.S. Appl. No. 14/705,893", dated Nov. 17, 2016, 2 Pages.

"Non-Final Office Action Issued in U.S. Appl. No. 14/705,897", dated Jun. 8, 2016, 8 Pages.

"Notice of Allowance Issued in U.S. Appl. No. 14/705,897", dated Oct. 24, 2016, 9 Pages.

Ishizuka, et al., "Design of Electronic Equipment Casings for Natural Air Cooling: Effects of Height and Size of Outlet Vent on Flow Resistance", In Proceedings of Heat Transfer—Engineering Applications, Dec. 22, 2011, 11 Pages.

"International Search Report and Written Opinion Issued in PCT Application No. PCT/US2016/013308", dated Apr. 25, 2016, 12 Pages.

"Second Written Opinion Issued in PCT Application No. PCT/US2016/012012", dated Jan. 4, 2017, 6 Pages.

"International Search Report and Written Opinion Issued in PCT Application No. PCT/US2016/012012", dated Apr. 25, 2016, 11 Pages.

"Second Written Opinion Issued in PCT Application No. PCT/US2016/013308", dated Dec. 7, 2016, 8 Pages.

\* cited by examiner

FLEXIBLE THERMAL CONDUIT FOR AN ELECTRONIC DEVICE

This application is a continuation of U.S. patent application Ser. No. 14/705,893 titled "FLEXIBLE THERMAL CONDUIT FOR AN ELECTRONIC DEVICE", filed on May 6, 2015, which claims the benefit of U.S. Provisional Patent Application No. 62/105,684, titled "HEAT DISSIPATION DEVICE", filed on Jan. 20, 2015, both of which are incorporated herein by reference in their entirety.

BACKGROUND

Cooling capacity for passively cooled electronic devices is limited by the area of surfaces available for heat transfer via radiation and natural convection, and the orientation of those surfaces. In products that have a housing to isolate electronic components from the environment, there is an inherent limit on heat exchange surface area, which imposes significant design challenges. Heat dissipation is even more of a challenge for compact, low-mass and low-volume consumer product designs.

SUMMARY

Introduced here is a flexible thermal conduit that runs from a first housing portion of an electronic device to a second housing portion of the electronic device, to convey heat generated by an electronic component in the first housing portion to a heat dissipation structure in the second housing portion. The flexible thermal conduit is particularly useful where the first housing portion (which includes the electronic component) has insufficient space for the heat dissipation structure. Moreover, the flexible thermal conduit is particularly useful in products where the second housing portion is flexibly coupled to the first housing portion, for example, by a hinge or other type of joint.

In certain embodiments the flexible thermal conduit includes a plurality of layers of flexible thermal conduit material, where the layers are not affixed to each other in the region where the second housing portion is coupled to the first housing portion, thereby enabling the layers to flex independently of each other in that region. The layers can include, for example, one or more layers of flexible graphite and/or one or more layers of thin metal.

Other aspects of the technique will be apparent from the accompanying figures and detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

DETAILED DESCRIPTION

In this description, references to "an embodiment", "one embodiment" or the like, mean that the particular feature, function, structure or characteristic being described is included in at least one embodiment of the technique introduced here. Occurrences of such phrases in this specification do not necessarily all refer to the same embodiment. On the other hand, the embodiments referred to also are not necessarily mutually exclusive.

The flexible thermal conduit introduced here is particularly useful in products that have multiple housing portions that are movably coupled to each other, where it is impractical (e.g. to space limitations) to locate the heat dissipation structure in the same housing portion as the heat generating components. One example of such a product, as described further below, is a head mounted display (HMD) device, where the first housing portion is a space- and weight-constrained visor assembly that contains display elements and other heat-generating electronics, and the second housing portion is part of a head fitting assembly that enables the device to be worn on a user's head, where the head fitting assembly is flexibly connected to the visor assembly (e.g., by a hinge). Note, however, that the flexible thermal conduit introduced here can also be incorporated advantageously into many other types of products, such as in laptop computers or flip-top type cell phones (e.g., to transfer heat from the display portion to the main body of the device via a hinge).

Figure 1:
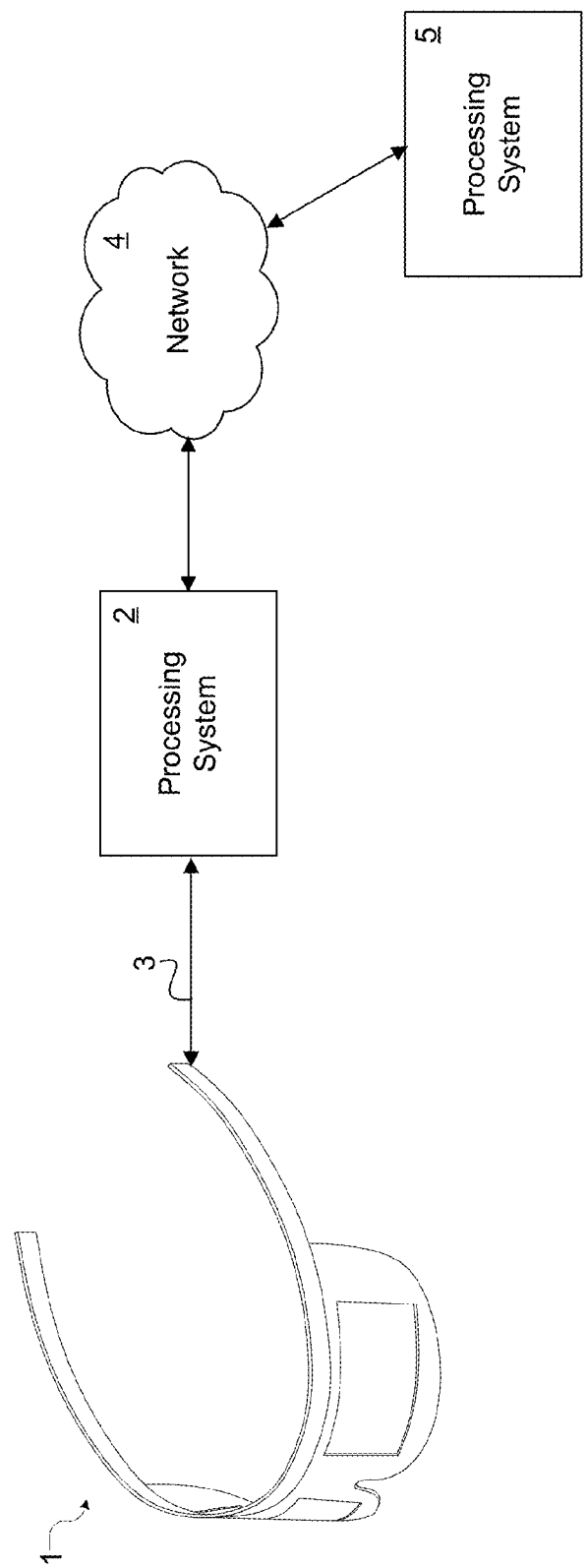
FIG. 1 shows an example of an environment in which an AR-HMD device can be used.

An HMD device can be used for augmented reality (AR) and/or virtual reality applications, for example. AR HMD devices ("AR-HMD" devices) include transparent display elements that enable a user to see concurrently both the real world around them and AR content displayed by the device. FIG. 1 schematically shows an example of an environment in which an AR-HMD device such as described herein can be used. In the illustrated example, the AR-HMD device 1 is configured to communicate data to and from an external processing device 2 through a connection 3, which can be a wired connection, a wireless connection, or a combination thereof. In other use cases, however, the AR-HMD device 1 may operate as a standalone device. The connection 3 can be configured to carry any kind of data, such as image data (e.g., still images and/or full-motion video, including 2D and 3D images), audio, multimedia, voice, and/or any other type(s) of data. The processing system 2 may be, for example, a game console, personal computer, tablet computer, smartphone, or other type of processing device. The connection 3 can be, for example, a universal serial bus (USB) connection, Wi-Fi connection, Bluetooth or Bluetooth Low Energy (BLE) connection, Ethernet connection, cable connection, DSL connection, cellular connection (e.g., 3G, LTE/4G or 5G), or the like, or a combination thereof. Additionally, the processing system 2 may communicate with one or more other processing systems via a network 4, which may be or include, for example, a local area network (LAN), a wide area network (WAN), an intranet, a metropolitan area network (MAN), the global Internet, or a combination thereof.

Figure 2:
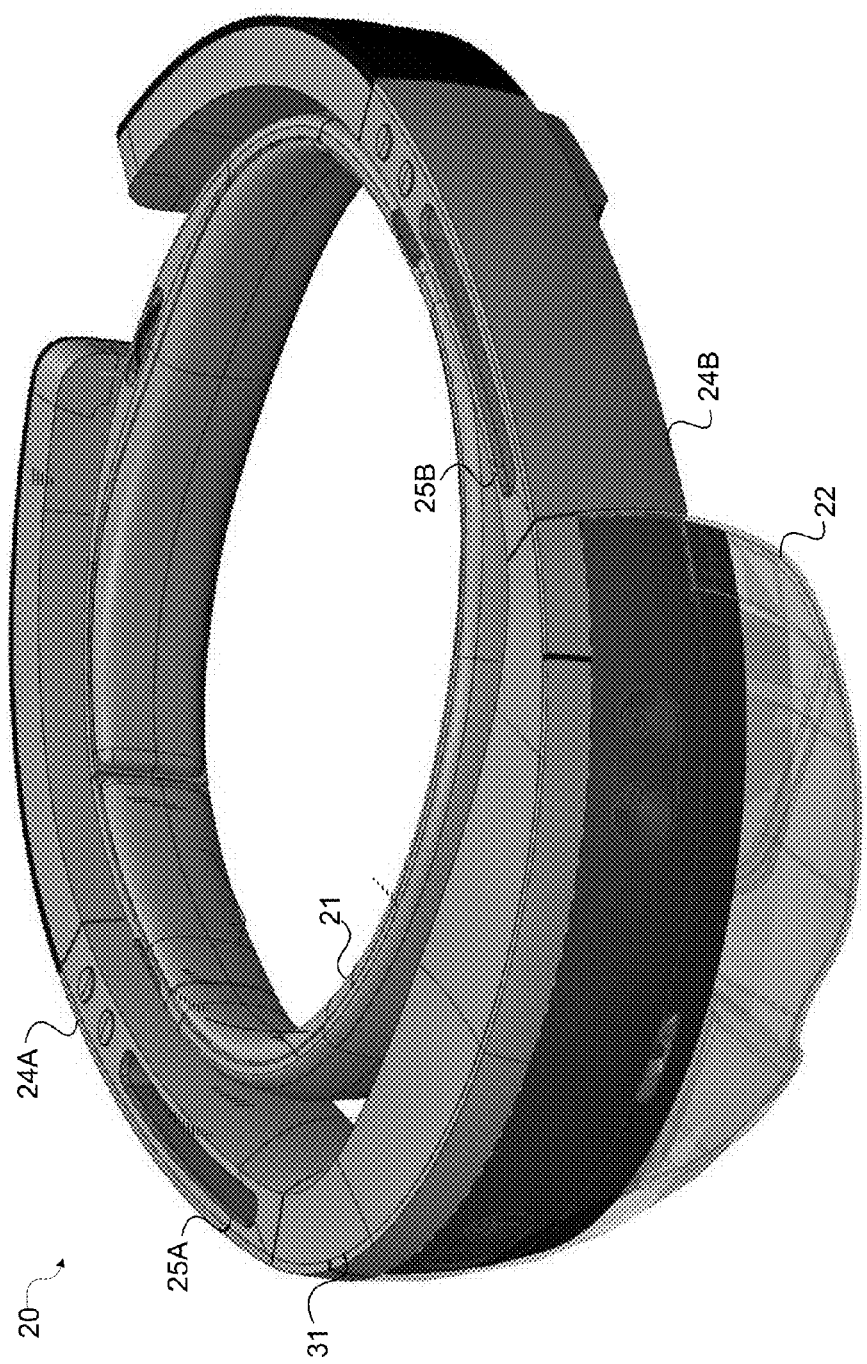
FIG. 2 is a perspective view of an example of an AR-HMD device.

FIG. 2 shows a perspective views of an illustrative AR-HMD device 20 (hereinafter simply "HMD device" or "device" 20) that can incorporate the features introduced here, according to one embodiment. In certain embodiments, the display components, sensors and processing electronics of the HMD device 20 are mounted on a chassis 31, as described in detail below. The chassis 31 is part of a protective sealed visor assembly 22 that contains the sensors, electronics, and display components, including left and right AR displays 23, at least some of which generate heat when in operation. The AR displays 23 are designed to overlay images on the user's view of his real-world environment, e.g., by projecting light into the user's eyes. Right and left side arms 24A and 24B, respectively, are structures that attach to the chassis 31 at the left and right open ends of the chassis 31, respectively, via a flexible or rigid fastening mechanisms (including one or more hinges, clamps, etc.). The HMD device 20 includes an adjustable headband (or other type of head fitting) 21, attached to the side arms 24A and 24B, by which the AR-HMD device 20 can be worn on a user's head.

In addition to the display elements, the visor assembly 22 may enclose various other components, such as: an ambient light sensor (ALS), one or more microphones to input speech from the user (e.g., for use in recognizing voice commands and providing audio effects); one or more visible-spectrum head-tracking tracking cameras for use in capturing images of surrounding surfaces to allow tracking of the user's head position and orientation in real-world space; one or more infrared (IR) spectrum depth cameras for use in determining distances to nearby surfaces (e.g., for use in surface reconstruction to model the user's environment); one or more IR illumination sources for use with the depth camera(s); one or more visible spectrum video cameras for use in capturing standard video of what the user sees. Note that the term "visible" in the context of this description means visible to a typical human being. The visor assembly may also enclose electronic circuitry to control at least some of the aforementioned elements and to perform associated data processing functions. The circuitry may include, for example, one or more processors and one or more memories.

The HMD device 20 may also include one or more audio speakers to output sound to the user. Note that in other embodiments the aforementioned components may be located in different locations on the AR-HMD device 20. Additionally, some embodiments may omit some of the aforementioned components and/or may include additional components not mentioned above.

Figure 3:
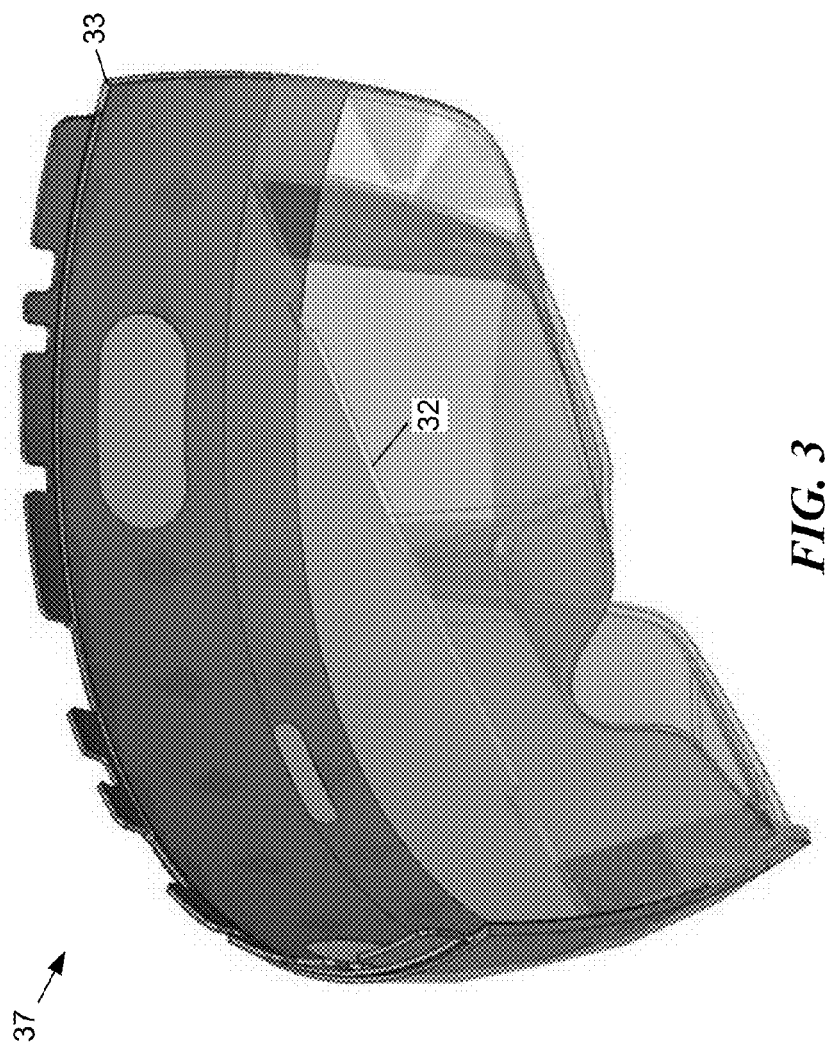
FIG. 3 shows a rear perspective view of the shield enclosure.
Figure 4B:
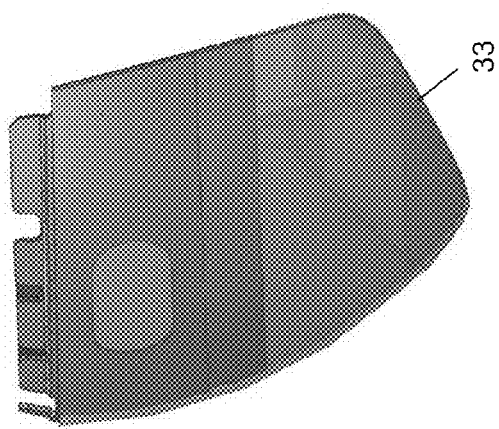
FIGS. 4A and 4B show front and left side orthogonal views, respectively, of the front shield of the shield enclosure.
Figure 4A:
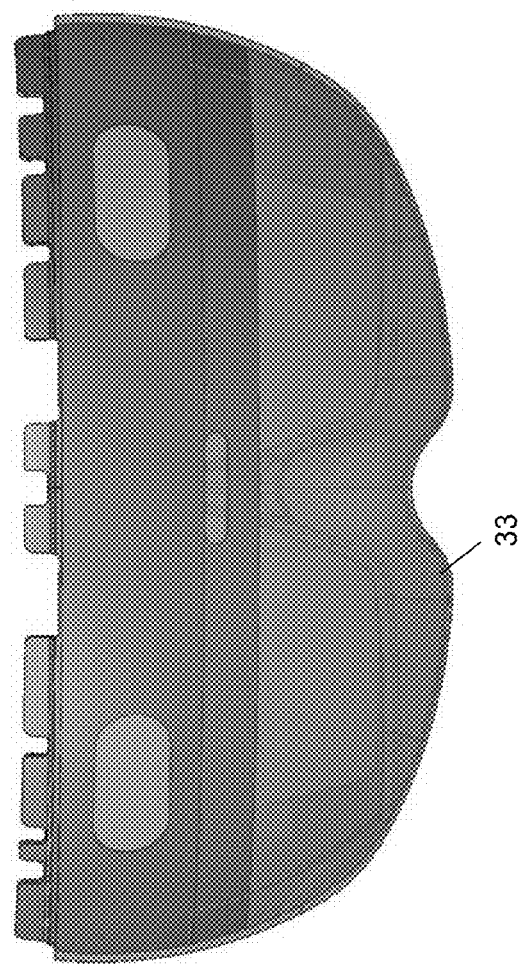

The visor assembly 22 provides the user with a relatively unobstructed view of the user's surrounding real world environment while also providing physical protection of the sensitive display components and sensors. In certain embodiments the visor assembly 22 includes the chassis 31, various display elements, sensors and electronics, and a protective shield enclosure 37. The shield enclosure 37 is further illustrated according to one embodiment in FIGS. 3, 4A and 4B. FIG. 3 shows a rear perspective view of the shield enclosure 37. The shield enclosure 37 includes a rear shield 32 and a front shield 33. FIGS. 4A and 4B show, respectively, front and left side orthogonal views of the front shield 33 of the shield enclosure 37. In this disclosure, the term "rear" generally refers to a part or surface that is closest to the user (wearer) of the HMD, while the term "front" generally refers to a corresponding part or surface that is farthest from the user. In the fully assembled product, the display elements (not shown) are suspended within the visor assembly 22. The optics and sensors are also mounted to the chassis 31 within the shield enclosure 37.

In certain embodiments, heat generated by the components within the visor simply 22 is conveyed by two flexible thermal conduits (not shown in FIG. 2), one on the left side of the visor assembly 22 and one on the right side, to a heat dissipation structure in each of the side arms 24A and 24B. Each side arm 24A or 24B is a curved, elongated member that roughly follows the curvature of the headband 21. Each side arm 24A or 24B has a substantially rectangular cross-section. Each side arm 24A or 24B includes a heat dissipation structure that forms a thermal tunnel 25A or 25B that passes entirely through the side arm 24A or 24B, from the top surface to the bottom surface of the side arm, thereby providing a channel that allows air to low freely vertically through the body of the side arm 24A or 24B. The thermal tunnel 25A or 25B is thereby oriented such that the usual orientation of the device 1, when in use, favors natural rising air flow through the thermal tunnel 25A or 25B.

Figure 5A:
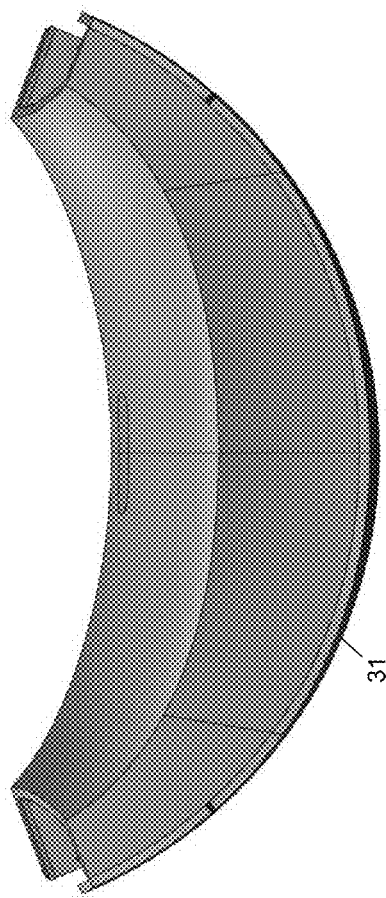
FIGS. 5A, 5B and 5C show top, right side and front orthogonal views of the chassis.
Figure 5C:
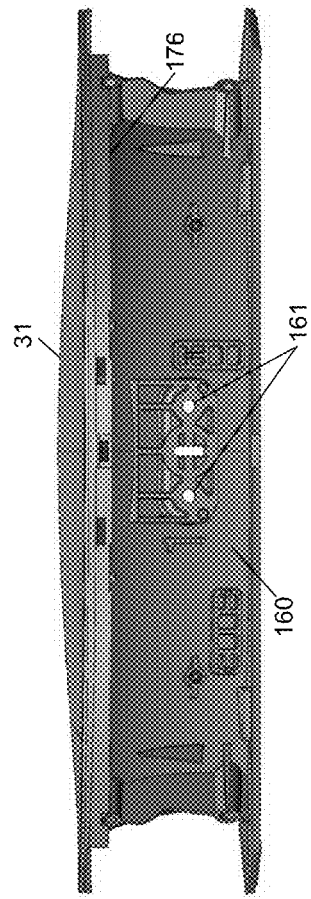
Figure 5B:
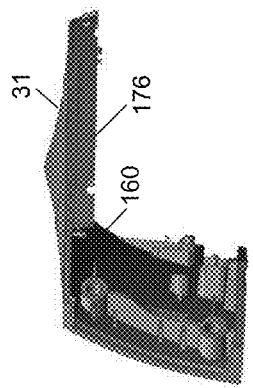
Figure 6:
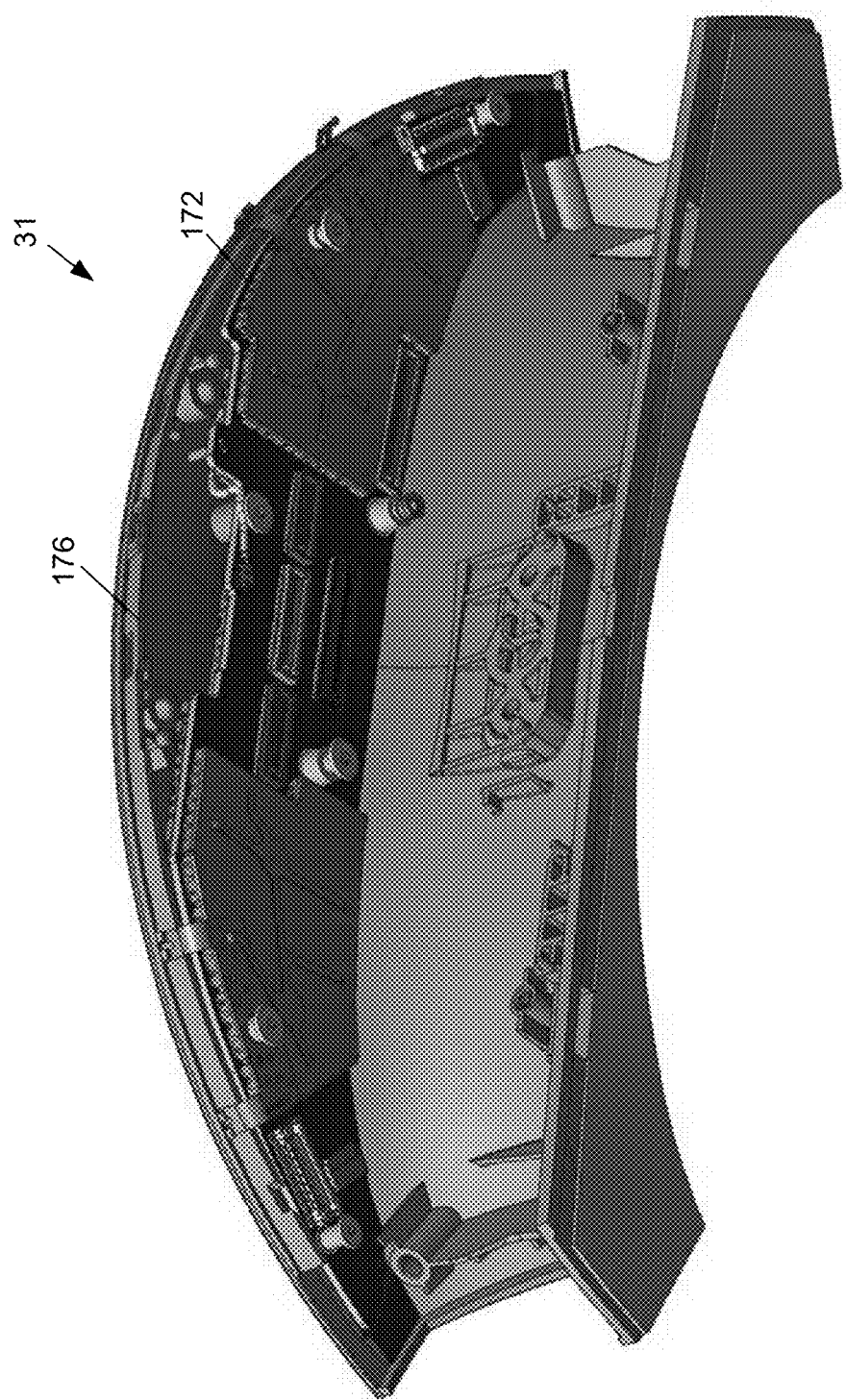
FIG. 6 shows a front perspective view of the chassis, with a printed circuit board (PCB) mounted to it.

Before further describing the heat dissipation elements of HMD device 20, it is useful to consider further its basic structure, according to at least one embodiment. As mentioned above, the visor assembly 22 includes the chassis 31 and the shield enclosure 37 (see FIG. 2). The chassis 31 is the structural component by which all of the display elements, optics, sensors and electronics are coupled to the rest of the HMD device 20. FIGS. 5A, 5B and 5C show, respectively, top, front and right-side views of the chassis 31, while FIG. 6 shows a perspective view of the chassis 31. The chassis 31 can be formed of molded plastic or polymer, for example. The front surface 160 of the chassis 31 may include various fixtures (e.g., screw holes, raised flat surfaces, etc.) to which the sensor assembly (not shown) can be attached. For example, the chassis 31 has screw holes (or other similar mounting fixtures) 161 by which a display assembly (described below) can be attached to it. The chassis 31 further has one or more fixtures by which at least one printed circuit board (PCB) 172 bearing the electronic components of the HMD 20 can be mounted, as shown in FIG. 6. FIG. 6 shows a front perspective view of the chassis 31 with a PCB 172 mounted to a top inner surface 176 of the chassis 31 (see FIGS. 5A, 5B and 5C).

Figure 7:
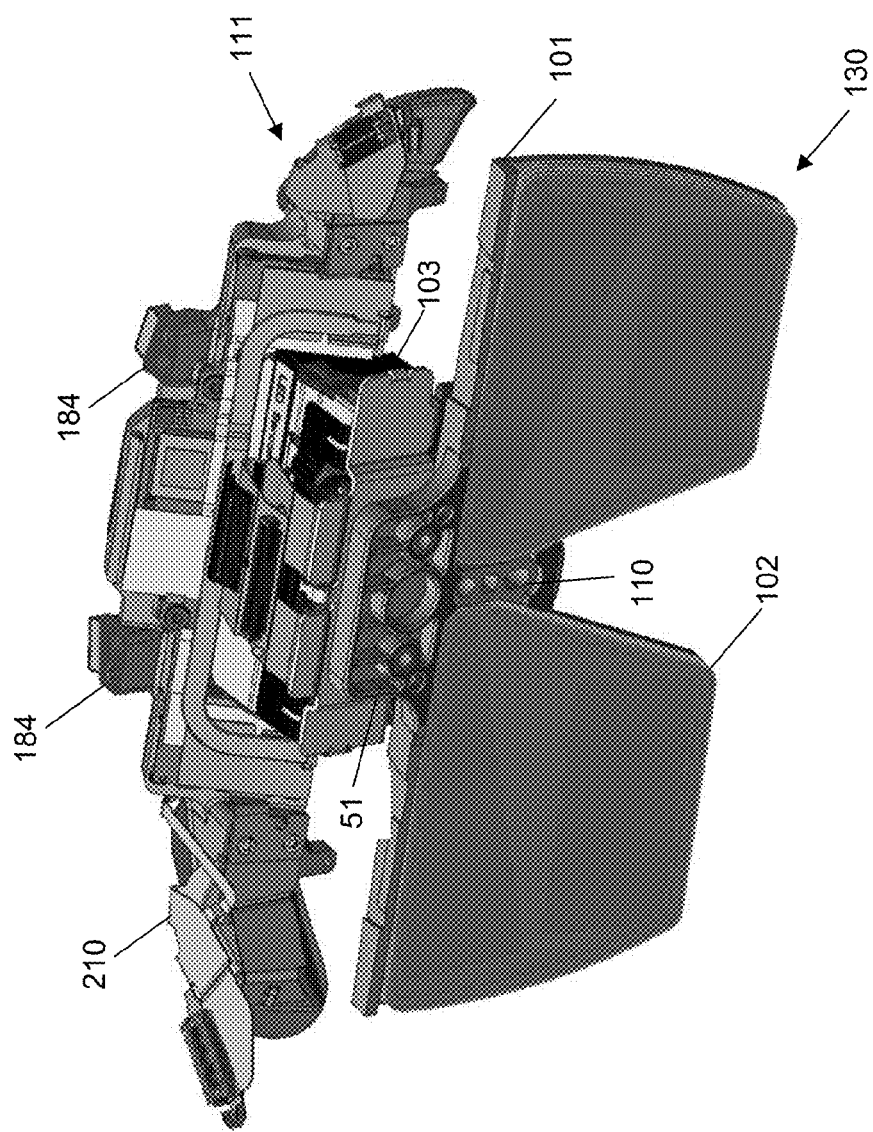
FIG. 7 shows a rear perspective view of the display assembly and sensor assembly coupled to each other.

Enclosed within the visor assembly 22 and mounted to the chassis 31 are two main assemblies, namely, a sensor assembly 111 and a display assembly 130, which are illustrated in combination in FIG. 7. The sensor assembly 111 includes a sensor frame 210 and various sensors mounted to it (e.g., head-tracking cameras, IR depth camera, visible-spectrum camera, and ambient light sensor) and IR light sources. FIG. 7 shows a rear perspective view of the display assembly 130 (including optics assembly and a display engine 103) and sensor assembly 111, coupled to each other. The sensor frame 210 can attach to the top inner surface 176 of the chassis 31 (see FIGS. 5A, 5B and 5C) via mounting points 184, for example, by screws or other fastening mechanism.

The display assembly 130 includes a transparent waveguide carrier 101, on which are mounted multiple transparent waveguides 102, and a display engine 103. The display engine 103 contains one or more light-emission elements (e.g., light-emitting diodes (LEDs), not shown) for each of the left and right eye of the user. The display engine 103 is mounted to the waveguide carrier 101 at the center tab 51, such that light emitted by the display engine 103 is optically coupled to the waveguides 102, which convey the emitted light toward the user's eyes. In the fully assembled product, the waveguide carrier 101 (with waveguides 102 and display engine 103 mounted to it) is mounted to the inside vertical surface of the chassis 31 through the nose bridge region 110 of the waveguide carrier 101, as further shown in FIG. 8. The sensor assembly 111 is mounted to the waveguide carrier 101 at the nose bridge region 110 and to the chassis 31.

Figure 8:
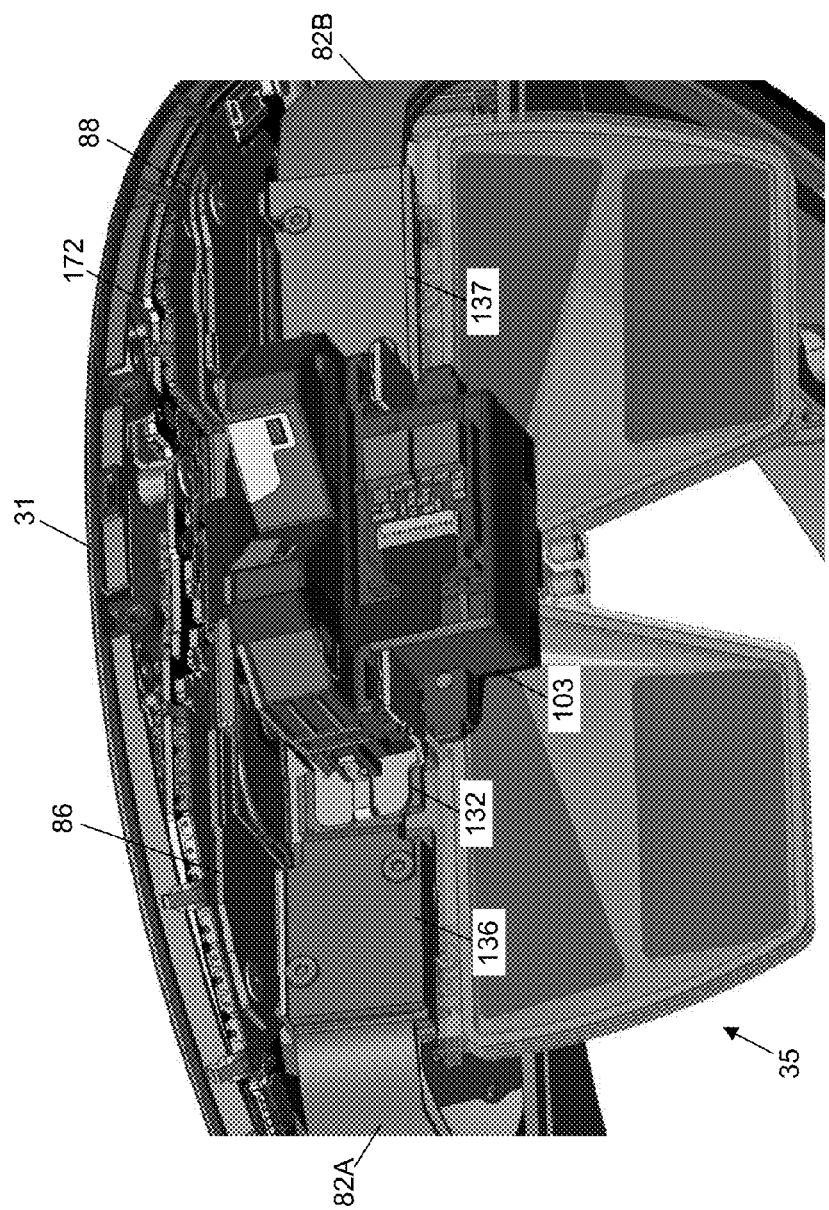
FIG. 8 shows a front perspective view of the display assembly and sensor assembly coupled to the chassis and to flexible thermal conduits.

FIG. 8 shows a front perspective view of how the combined sensor assembly 111 and display assembly 130 can be mounted to the chassis 31. Various components in the HMD device 20 generate heat during operation, including the display engine 103 and electronics mounted on the PCB 172. Accordingly, two flexible thermal conduits 82A and 82B conduct heat away from these components to the thermal tunnels 25A and 25B, respectively, in the side arms 24A and 24B, respectively (FIG. 2). FIG. 8 shows a portion of the flexible thermal conduits 82A and 82B and the manner in which they can be thermally coupled to the heat generating components.

Specifically, the display engine 103 includes, or is coupled to, a metallic thermal plate 132, which conducts heat away from the display engine 103. Part of thermal plate 132 lies flat against a thermally conductive bracket 136. This configuration allows heat from the display engine 103 to be conducted onto flexible thermal conduit 82A via thermal bracket 136. An L-shaped thermal spreader 86 has a horizontal portion that is thermally coupled to PCB 172 and vertical portion (hidden by bracket 136) that is thermally coupled to the back of bracket 136.

Brackets 136 and 137 clamp the anterior ends of flexible thermal conduits 82A and 82B, respectively, to the chassis 31; the opposite (posterior) ends of thermal conduits 82A and 82B can be coupled to the thermal tunnels 25A and 25B in side arms 24A and 24B, as discussed further below. Bracket 137 is an L-shaped (right-angle) bracket, having a horizontal upper portion and a vertical lower portion. The horizontal upper portion of bracket 137 lies flat against the PCB 172 on the inner horizontal surface of the chassis 31. More precisely, in the illustrated embodiment the horizontal upper portion of bracket 137 lies against a thin, flat heat spreader 88, which is sandwiched between the upper portion of bracket 137 and PCB 172. This configuration allows heat generated by electronic components on the PCB 172 to be conducted away from those components and onto flexible thermal conduit 82B, via heat spreader 88 and bracket 137.

In the illustrated embodiment, each of the flexible conduits 82A and 82B includes multiple layers of thin, flat, thermally conductive material, such as flexible graphite or very thin metal, stacked on top of each other. For example, one or more of the layers of flexible conduits 82A and 82B may be made of, for example, eGRAF® SPREADER-SHIELD™ SS500 Graphite, from GrafTech International. In alternative embodiments, a flexible conduit 82A or 82B may consist of only a single layer. Additionally, in other embodiments, one or more layers of a flexible thermal conduit 82A or 82B can be made of a material other than graphite, such as a substrate loaded with graphene, or a thin layer of metal such as copper. In alternative embodiments, a flexible thermal 82A or 82B can be implemented in the form of a flexible heat pipe or vapor chamber.

Heat generated by the display engine 103 or electronics on PCB 172 is conducted by flexible thermal conduits 82A and 82B away from the visor assembly 22 to the thermal tunnels 25A and 25B in the side arms 24A and 24B, respectively, as discussed further below, where the heat is dissipated into the air.

Figure 9:
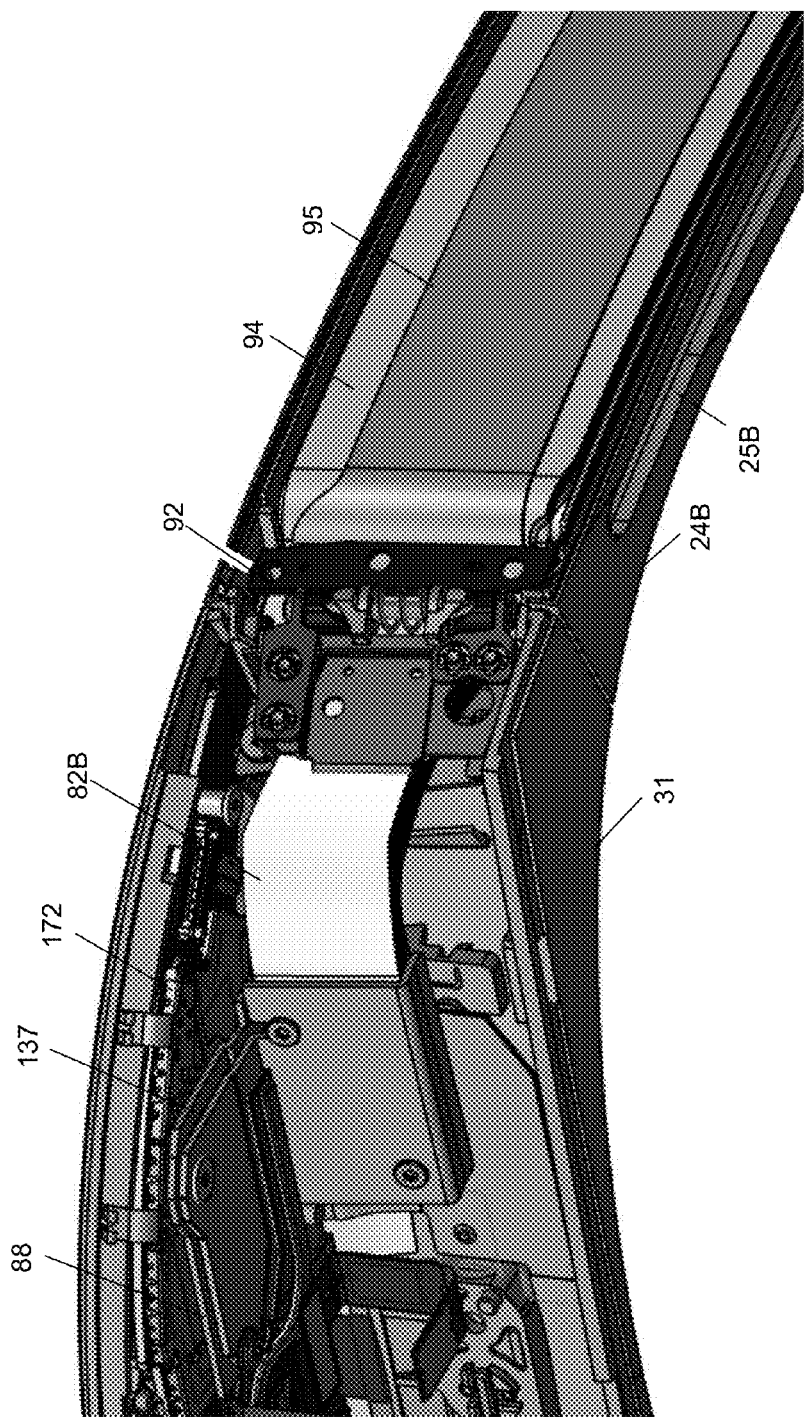
FIG. 9 shows a perspective view of the coupling between the left side arm and the chassis.

Each side arm 24A or 24B can be coupled to the chassis 31 via a hinge assembly, as shown by example in FIG. 9, which allows the side arm 24A or 24B to flex relative to the visor assembly 22. FIG. 9 shows the hinge assembly 92 connecting the left side arm 24B to the chassis 31 (the configuration is essentially identical for the right side arm). Note that the sensor assembly 111 and display assembly 130 are not included in the view of FIG. 9. The flexible thermal conduit 82B passes under the hinge assembly 92 and couples to a tunnel core (described further below), which is the heat dissipation component that forms the thermal tunnel 25B (FIG. 2), as described further below.

Figure 10:
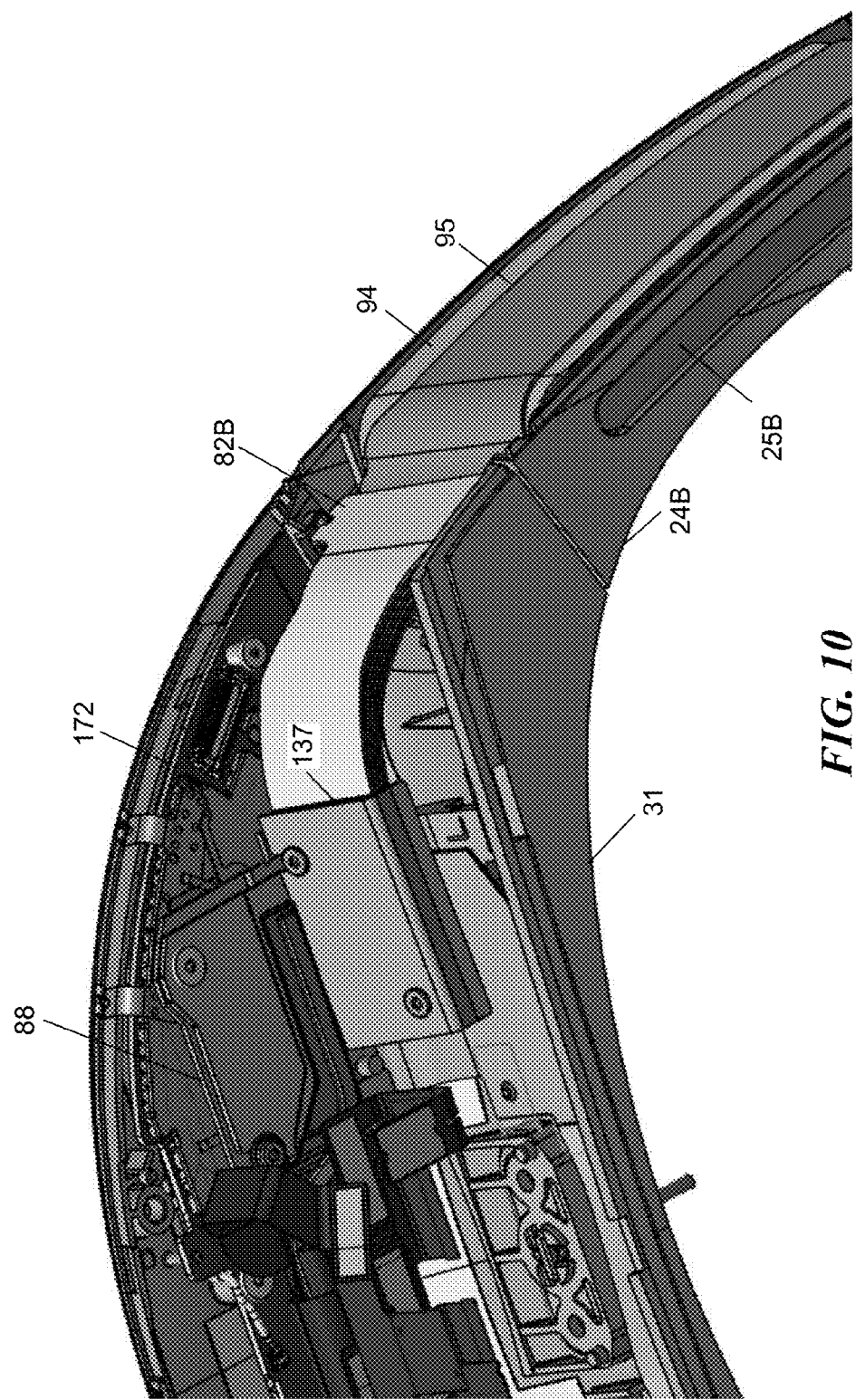
FIG. 10 shows a perspective view of the coupling between the left side arm and the chassis, without the mechanical hinge.

FIG. 10 shows a view similar to that of FIG. 9, but with hinge assembly 92 removed to provide a better view of thermal conduit 82B in the region of the hinge assembly 92. Note that the layers of thermal conduit 82B are not attached to each other, at least in the region of the hinge assembly 92, which enables them to flex independently of each other when the side arm 24A or 24B is flexed relative to the chassis 31. The ability of the layers to flex independently of each other increases their durability with respect to repeated flexing. It can be seen, therefore, that the flexible thermal conduit 82A or 82B effectively forms a durable, lightweight "thermal hinge."

Figure 11:
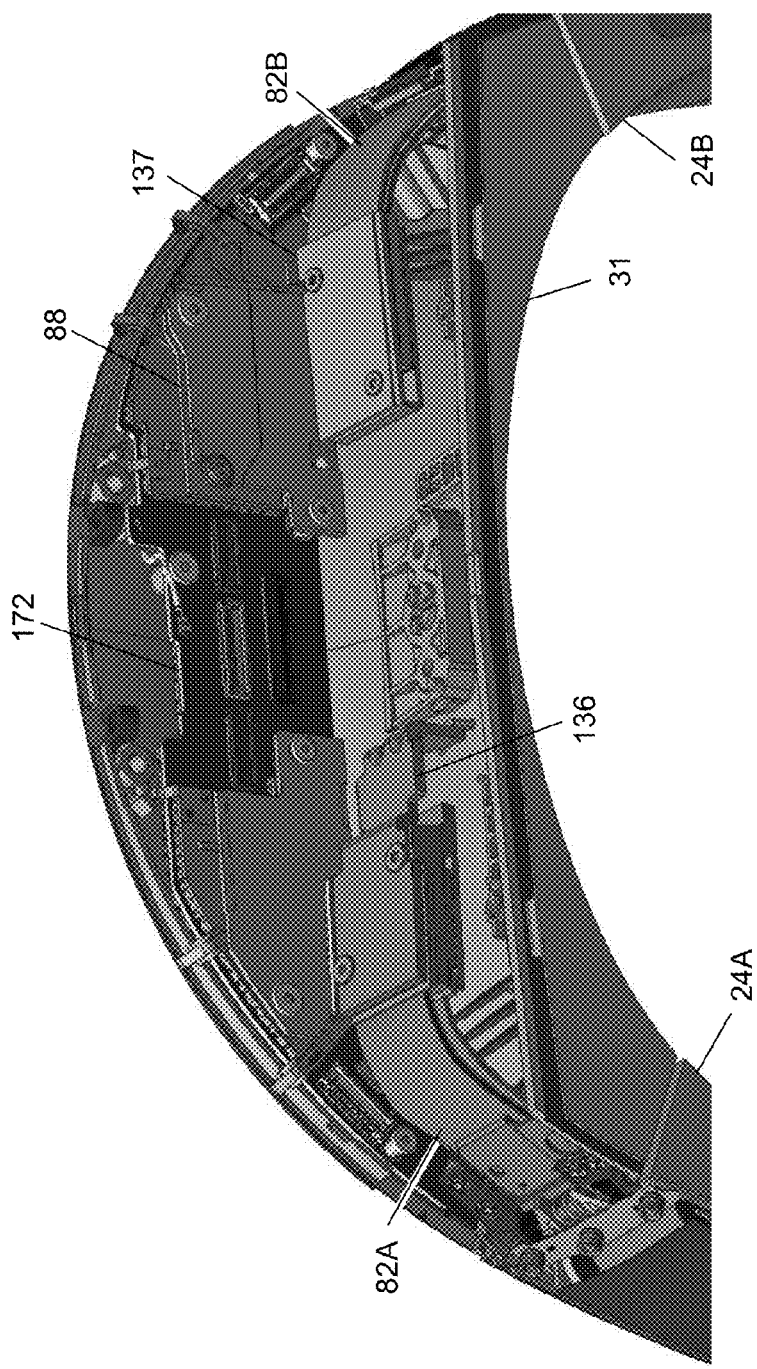
FIG. 11 shows a perspective view of how the flexible thermal conduits can be coupled to the chassis.
Figure 12:
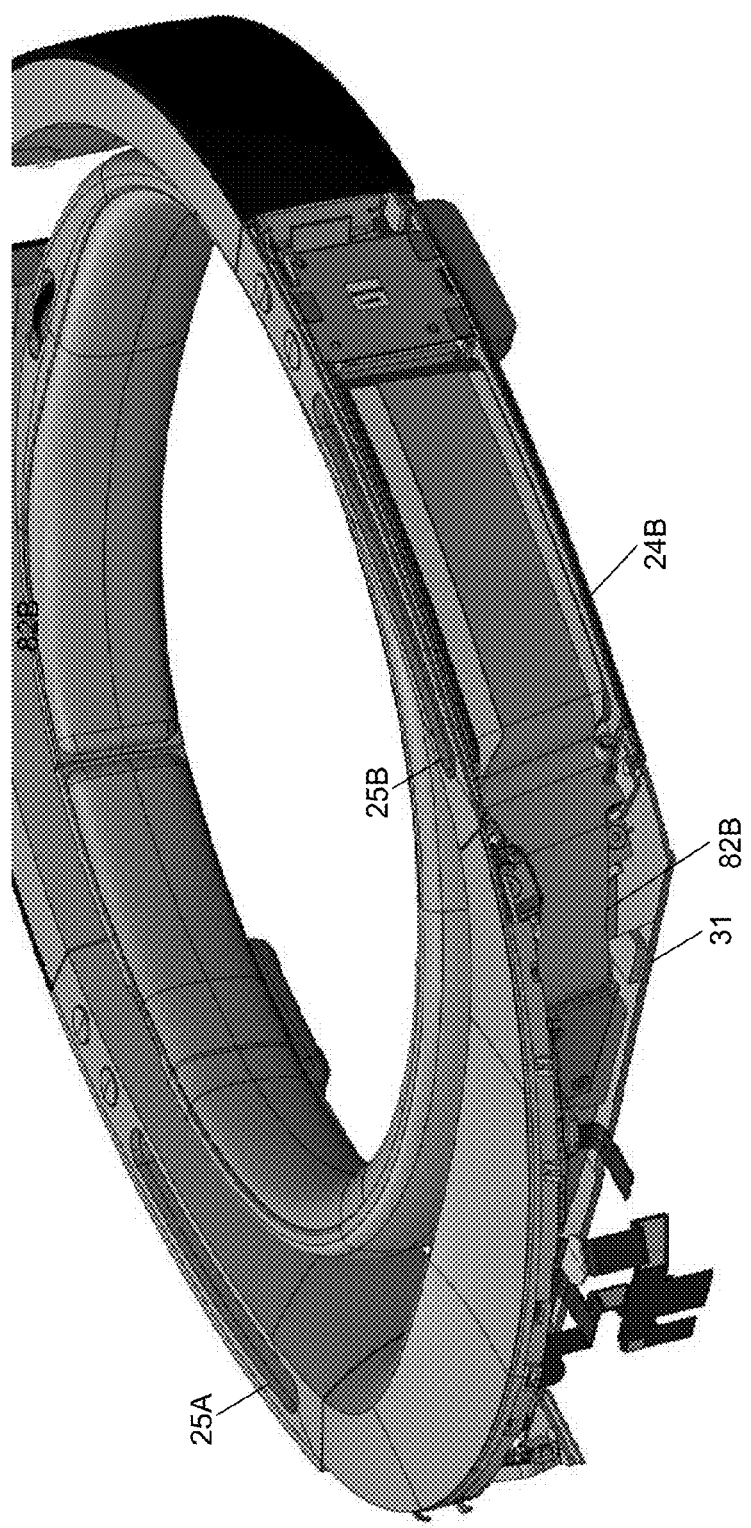
FIG. 12 is a perspective view showing how the flexible thermal conduit can be coupled to a thermal tunnel.

FIG. 11 is another perspective view that further illustrates how thermal conduits 82A and 82B can be coupled to the chassis 31. FIG. 12 is a left-side perspective view that further illustrates how the thermal tunnel 25A or 25B can be installed within the side arm 24A or 24B (in this case, the left side arm 24B) and coupled to a flexible thermal conduit 82A or 82B. The hinge 92 is also not included in the view of FIG. 12.

Figure 13:
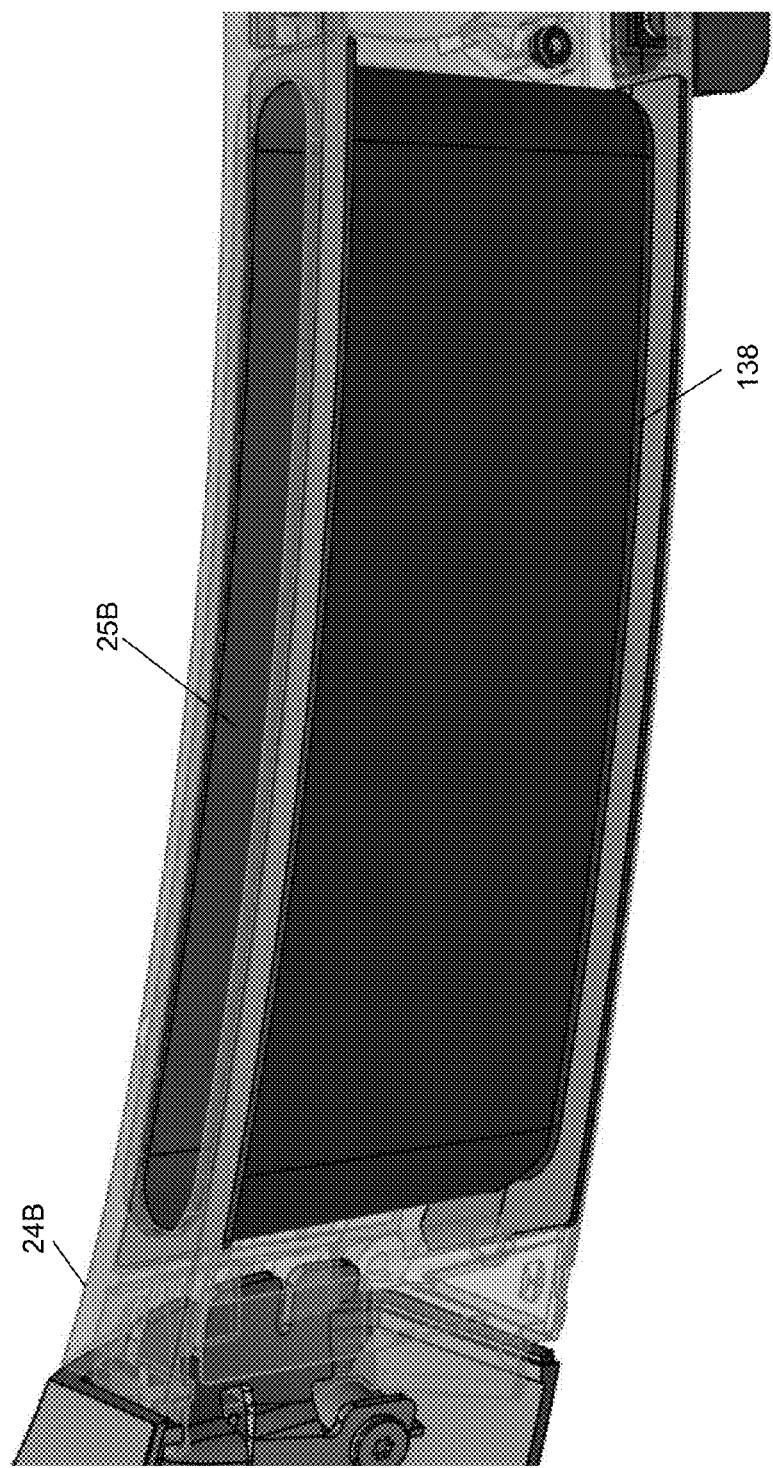
FIG. 13 shows a close-up left-side perspective view of the tunnel core installed in the left side arm.
Figure 14:
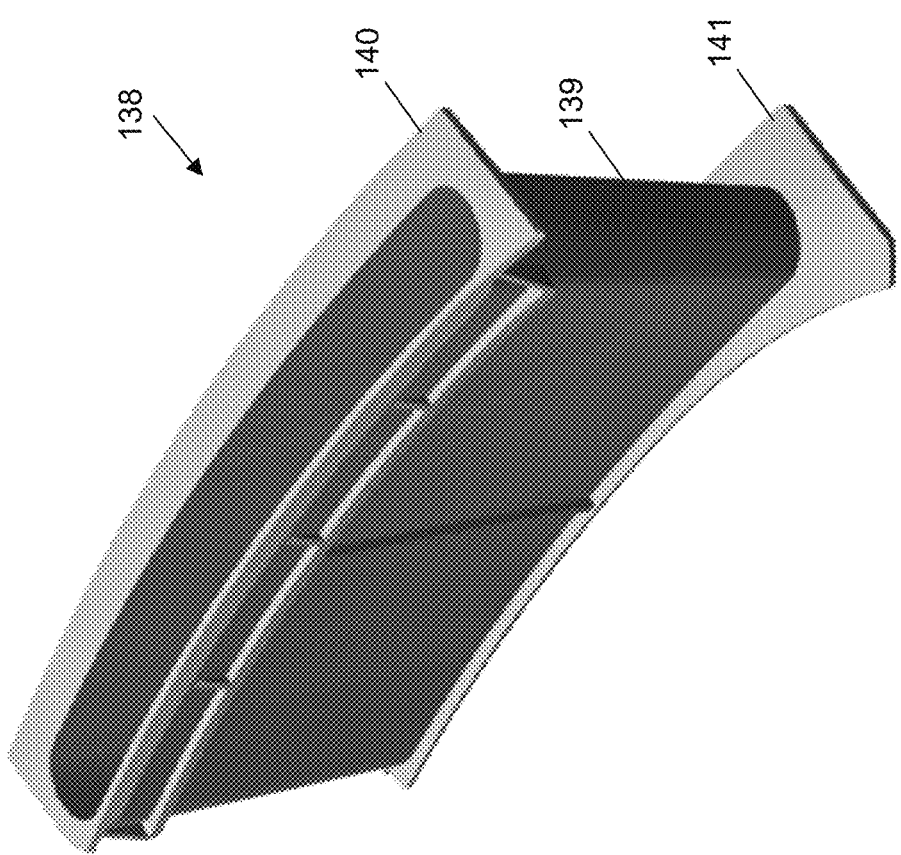
FIG. 14 shows a front-right perspective view of the tunnel core of the left side arm.
Figure 15A:
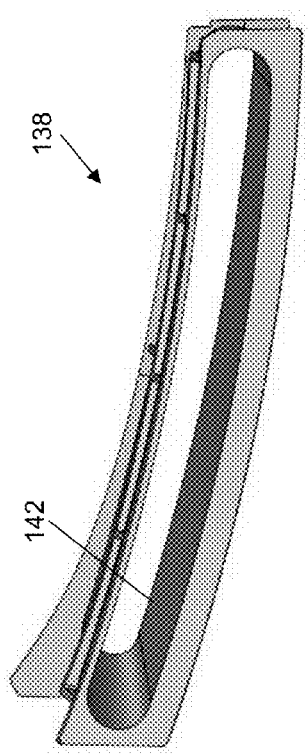
FIGS. 15A, 15B and 15C show top, front and left-side orthogonal views, respectively, of the tunnel core of the left side arm.
Figure 15C:
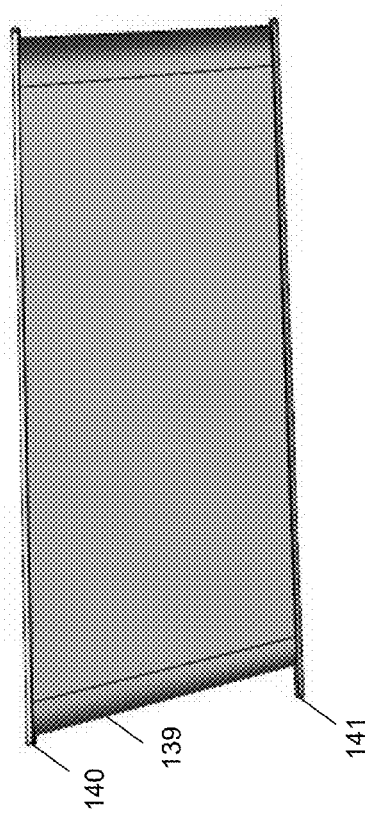
Figure 15B:
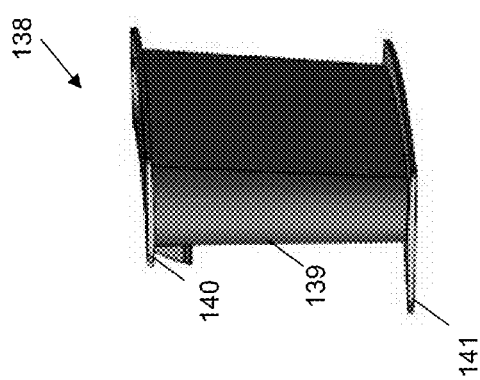

The thermal tunnel 25A or 25B located in each side arm 24A or 24B (see FIG. 2) will now be further described with reference to FIGS. 13 through 15. The thermal tunnel 25A or 25B is formed by a heat dissipation component called the "tunnel core". FIG. 13 shows a close-up left-side perspective view of the tunnel core 138 installed in the left side arm 24A, according to an embodiment. FIG. 14 shows a front-right perspective view of that same tunnel core 138 alone, and FIGS. 15A, 15B and 15C show top, front and left-side orthogonal views, respectively, of that same tunnel core 138.

Note that the tunnel core in the right side arm is simply the mirror image of tunnel core 138 shown in FIGS. 13 through 15.

The tunnel core 138 has a hollow main body 139 with flanges 140 and 141 extending from its top and bottom ends, respectively. The hollow center of the tunnel core 138 is shaped generally as a hollow oval cylinder, with flanges 140 and 141 forming the top and bottom surfaces, respectively. The interior surface 142 of the hollow tunnel core 138 forms part of the exterior surface of side arm 24B when tunnel core 138 is installed in side arm 24B. The interior surface 142 remains exposed to air and the fully assembled product and provides the surface area for dissipating heat into the air. The tunnel core 138 can be made of, for example, plastic, metal, or essentially any other rigid, thermally conductive material. If made of plastic, the tunnel core 138 can be formed by, for example, injection molding.

In alternative embodiments, the tunnel core 138 can be subdivided by ribs or partitions (not shown), that provide additional cooling surface area. These ribs or partitions can be formed as integral parts of the tunnel core 138, or they can be made as separate parts that are subsequently bonded to the tunnel core 138.

As mentioned above, in certain embodiments, at least some of the layers of the flexible thermal conduit 82B are thermally coupled to the tunnel core 138. In some such embodiments, the main body 139 of the tunnel core 138 can be wrapped at least partly (i.e., at least partially encircled) by one or more thicknesses of multi-layer, flexible, thermally conductive material, such as flexible graphite, to a thickness that extends approximately to the edges of the flanges 140 and 141. The layer(s) that is/are wrapped around the tunnel core 138 can be the continuation of one or more corresponding layer(s) of the flexible thermal conduit 82B. Alternatively, the thermally conductive layers wrapped around the tunnel core 138 can be formed separately from thermal conduit 82B and then subsequently thermally coupled to thermal conduit 82B during product assembly (e.g., physically attached to it) in any suitable manner, such as by clamping.

Figure 16:
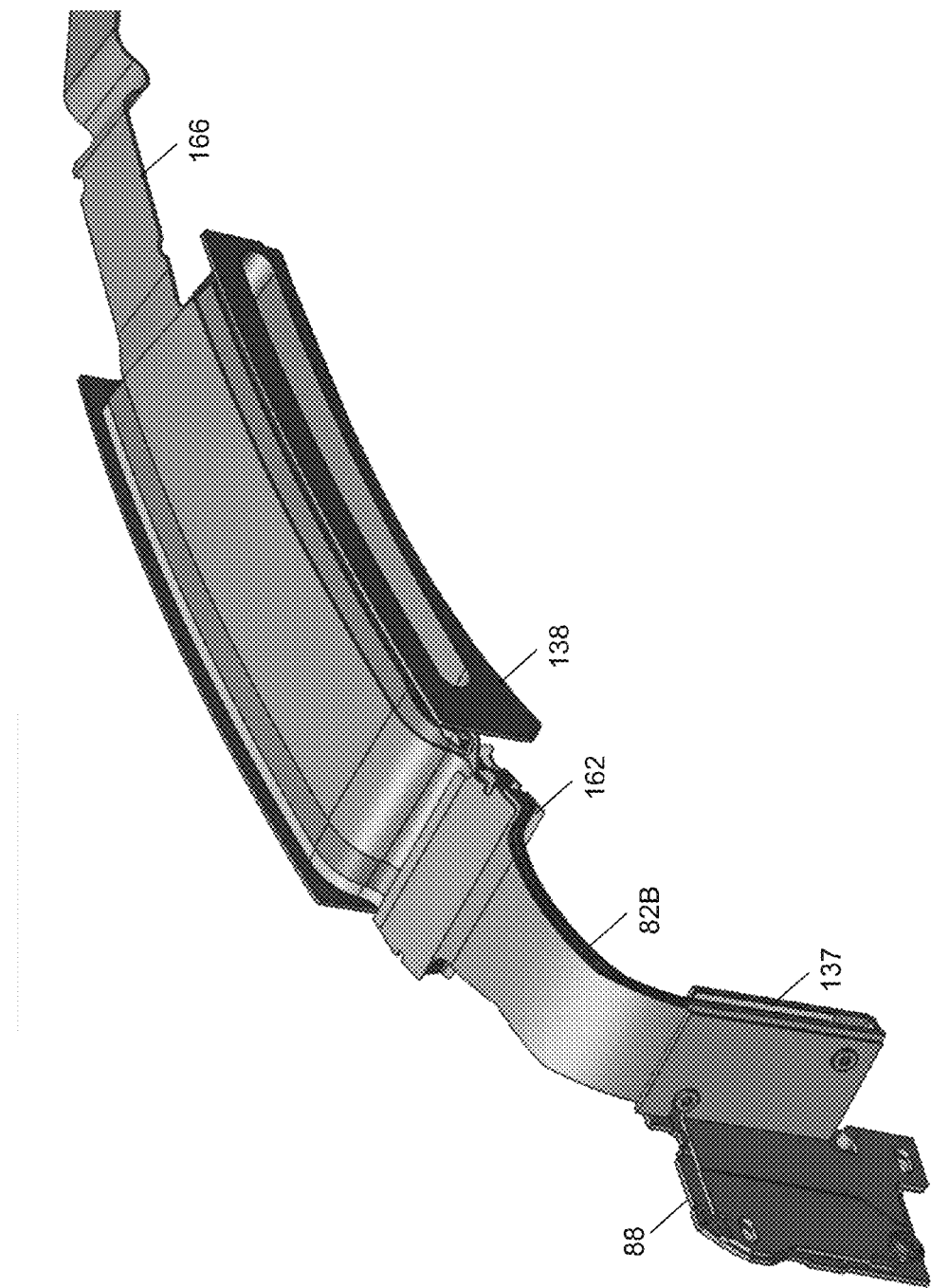
FIGS. 16 and 17 are perspective views illustrating the flexible thermal conduit and tunnel core of the left side arm.
Figure 17:
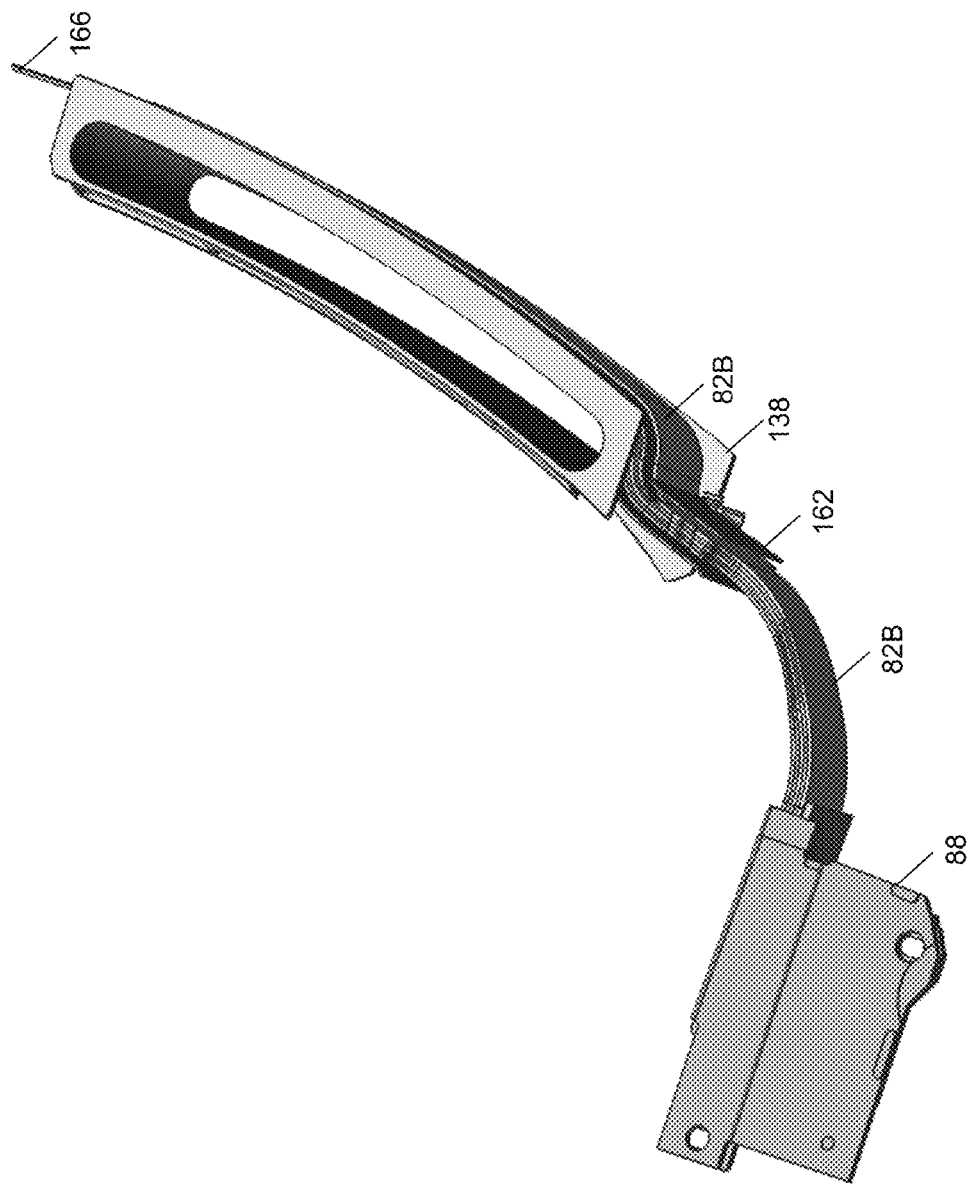
Figure 18:
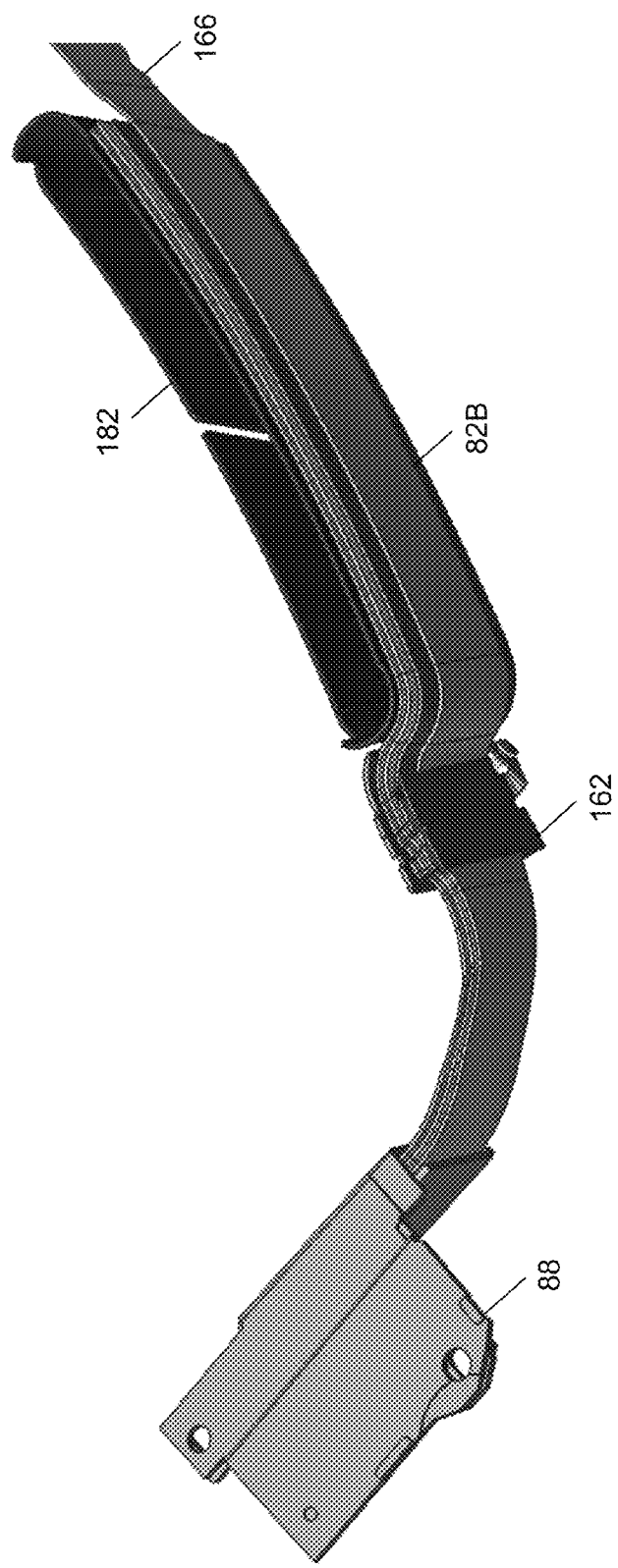
FIG. 18 is a perspective view illustrating the flexible thermal conduit and wrapping associated with the tunnel core of the left side arm.

FIGS. 16 through 18 further illustrate how the thermal tunnel can be thermally coupled to the flexible thermal conduit. In particular, FIGS. 16 and 17 are two corresponding perspective views illustrating how the left-side flexible thermal conduit 82B can be coupled to the tunnel core 138. Note that the corresponding components in the right side of the HMD 20 can be the same as (or mirror images of) those shown. FIG. 18 shows a related perspective view, but with the tunnel core 138 omitted to facilitate visualization of the layers of thermally conductive material.

In the illustrated embodiment, the layers of flexible thermal conduit 82B are held together by a clamp 162 next to the anterior end of the tunnel core 138 (note that clamp is not shown in FIGS. 9 through 12). As shown in FIG. 18, the main body 139 of the tunnel core 138 can be wrapped with (i.e., entirely encircled by) one or more layers 182 of flexible thermally conductive material, which may be but is not necessarily the same material as that of the thermal conduit 82B (e.g., flexible graphite). The layers of thermal conduit 82B are then laid in contact with the outboard side of the main body 139 (which has been wrapped with thermally conductive material). A thermally conductive adhesive (not shown) can be used to affix any of these layers to each other at the tunnel core 138 and/or to the main body 139 of the tunnel core 138. Such adhesive can be based on, for example, acrylics, silicones, epoxies, or any of various other thermosets. Optionally, one or more layers of the thermal conduit 82B can be extended to continue posteriorly past the tunnel core 138 toward the rear of the HMD 20, as shown, where additional heat generating components may be installed (e.g., batteries, not shown); these extended layers 166 can act as a thermal pipe to transfer heat away from those additional components, forward to the tunnel core 138.

Various other alternative embodiment are conceivable. For example, in some alternative embodiments, the thermally conductive layers wrapped around the tunnel core 138 may be rigid instead of flexible, such as very thin layers of metal, which are attached to the flexible thermal conduit 82A or 82B.

EXAMPLES OF CERTAIN EMBODIMENTS

Certain embodiments of the technology introduced herein are summarized in the following numbered examples:

1. An electronic device comprising: a first housing portion containing an electronic component that generates heat during operation; a second housing portion, flexibly coupled to the first housing portion, the second housing portion containing a heat dissipation structure; and a multi-layer flexible thermal conduit that passes from the first housing portion to the second housing portion, to convey heat generated by the electronic component to the heat dissipation structure.

2. An electronic device as recited in example 1, wherein the multi-layer flexible thermal conduit comprises a plurality of layers of flexible thermal conduit.

3. An electronic device as recited in example 2, wherein the plurality of layers of flexible thermal conduit are not affixed to each other in a region where the second housing portion is flexibly coupled to the first housing portion, such that the plurality of layers are able to flex separately in said region.

4. An electronic device as recited in example 2 or 3, wherein the plurality of layers of flexible thermal conduit comprise a plurality of layers of flexible graphite.

5. An electronic device as recited in any of examples 2 through 4, wherein the plurality of layers of flexible thermal conduit comprise a plurality of layers of metal.

6. An electronic device as recited in any of examples 1 through 5, wherein the thermal conduit comprises flexible graphite.

7. A head-mounted display device comprising: a visor assembly including a display assembly to cause an image to be displayed to a user, the visor assembly including an electronic component that generates heat during operation; a head fitting assembly, flexibly coupled to the visor assembly, by which the head-mounted display device can be worn on the head of the user, the head fitting assembly including a heat dissipation structure; and a flexible thermal conduit that passes from the visor assembly to the head fitting assembly, to convey heat generated by the electronic component to the heat dissipation structure in the head fitting assembly.

8. A head-mounted display device as recited in example 7, wherein the flexible thermal conduit comprises a plurality of layers of flexible thermal conduit material.

9. A head-mounted display device as recited in example 8, wherein the plurality of layers are not affixed to each other in a region where the head fitting assembly is flexibly coupled to the visor assembly, such that the plurality of layers are able to flex separately in said region.

10. A head-mounted display device as recited in example 8 or 9, wherein the plurality of layers comprise a plurality of layers of flexible graphite.

11. A head-mounted display device as recited in any of examples 8 through 10, wherein the plurality of layers comprise a plurality of layers of metal.

12. A head-mounted display device as recited in any of examples 7 through 11, wherein the flexible thermal conduit comprises flexible graphite.

13. A head-mounted display device comprising: a visor assembly containing a plurality of electronic components that generate heat when in operation, the visor assembly including a display component to display an image directly in front of an eye of a user; and a head fitting assembly, coupled to the visor assembly, by which the head-mounted display device can be worn on the head of the user, the head fitting assembly including a plurality of curved, elongate side arms, each flexibly coupled via a separate hinge to a different end of the visor assembly, each side arm including a heat dissipation structure; a plurality of flexible thermal conduits, a first one of which is coupled to the visor assembly and to a first one of the side arms and a second one of which is coupled to the visor assembly and to a second one of the side arms, each said flexible thermal conduit configured to convey heat generated by at least one of the plurality of electronic components to the heat dissipation structure in the corresponding one of the side arms, each said multi-layer flexible thermal conduit including a plurality of flat, elongate, flexible thermal conduit strips that are not affixed to each other in a region proximate to the corresponding hinge, such that the plurality of layers are able to flex separately in said region proximate to the corresponding hinge.

14. A head-mounted display device as recited in example 13, wherein the plurality of layers of flexible thermal conduit comprise a plurality of layers of flexible graphite.

15. A head-mounted display device as recited in example 13 or 14, wherein the plurality of layers of flexible thermal conduit comprise a plurality of layers of metal.

16. A head-mounted display device as recited in any of examples 13 through 15, further comprising a first thermally conductive bracket coupled to at least one of the electronic components and to a one of the flexible thermal conduits associated with one of the side arms.

17. A head-mounted display device as recited in example 16, wherein the first thermally conductive bracket secures together the plurality of flat, elongate, flexible thermal conduit strips of said one of the flexible thermal conduits.

18. A head-mounted display device as recited in example 16 or 17, further comprising a circuit board mounted to an interior surface of the visor assembly, the circuit board having at least some of the plurality of electronic components disposed thereon, wherein the first thermally conductive bracket is coupled to the circuit board.

19. A head-mounted display device as recited in example 18, further comprising a heat spreader held to the circuit board by the first thermally conductive bracket.

20. A head-mounted display device as recited in any of examples 16 through 19, further comprising a second thermally conductive bracket disposed proximate to the hinge associated with said one of the side arms, wherein the second thermally conductive bracket secures together the plurality of flat, elongate, flexible thermal conduit strips of said one of the flexible thermal conduits.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A head-mounted display device comprising:
a visor assembly including a display assembly to cause an image to be displayed to a user, the visor assembly including an electronic component that generates heat during operation;
a head fitting assembly, flexibly coupled to the visor assembly, by which the head-mounted display device can be worn on a head of the user, the head fitting assembly including a heat dissipation structure; and
a multi-layer flexible thermal conduit that passes from the visor assembly to the head fitting assembly via a region where the head fitting assembly is flexibly coupled to the visor assembly, to convey heat generated by the electronic component to the heat dissipation structure in the head fitting assembly, the multi-layer flexible thermal conduit including a plurality of stacked, flexible, thermally conductive layers, a surface of each layer of the plurality of stacked, flexible, thermally conductive layers being adjacent to a surface of another layer of the plurality of stacked, flexible, thermally conductive layers.

2. An electronic device as recited in claim 1, wherein the head fitting assembly is coupled to the visor assembly via a hinge.

3. An electronic device as recited in claim 1, wherein the plurality of stacked, flexible, thermally conductive layers are affixed to each other in a first region and in a second region but are not affixed to each other in a central region between the first region and the second region, the central region being adjacent to the region where the head fitting assembly is flexibly coupled to the visor assembly.

4. A head-mounted display device as recited in claim 1, wherein the plurality of stacked, flexible thermally conductive layers comprise a plurality of layers of flexible graphite.

5. A head-mounted display device as recited in claim 1, wherein the plurality of flexible thermally conductive layers comprise a plurality of layers of metal.

6. A head-mounted display device comprising:
a visor assembly containing a plurality of electronic components that generate heat when in operation, the visor assembly including a display component to display an image directly in front of an eye of a user;
a head fitting assembly, coupled to the visor assembly, by which the head-mounted display device can be worn on a head of the user, the head fitting assembly including a plurality of curved, elongate side arms, each flexibly coupled to a different end of the visor assembly, each of said side arms including a heat dissipation structure; and
a plurality of multi-layer flexible thermal conduits, a first one of the multi-layer flexible thermal conduits which is coupled to the visor assembly and to a first one of the side arms and a second one of the multi-layer flexible thermal conduits which is coupled to the visor assembly and to a second one of the side arms, each of said multi-layer flexible thermal conduits configured to convey heat generated by at least one of the plurality of electronic components to the heat dissipation structure in a corresponding one of the side arms, each of said multi-layer flexible thermal conduits including a plurality of flat, elongate, flexible thermal conduit strips, wherein each of said multi-layer flexible thermal conduits includes a plurality of stacked, flexible, thermal conductive strips, a surface of each strip of the plurality of stacked, flexible, thermally conductive strips being adjacent to a surface of another strip of the plurality of stacked, flexible, thermally conductive strips.

7. An electronic device as recited in claim 6, wherein the head fitting assembly is coupled to the visor assembly via a plurality of hinges, each of said hinges coupling the visor assembly to a separate one of the side arms.

8. An electronic device as recited in claim 6, wherein in each of said multi-layer flexible thermal conduits, the plurality of stacked, flexible, thermally conductive layers are affixed to each other in a first region and in a second region but are not affixed to each other in a central region between the first region and the second region, the central region being adjacent to a region where a corresponding one of said multi-layer flexible thermal conduits is flexibly coupled to the visor assembly.

9. A head-mounted display device as recited in claim 6, wherein the plurality of flat, elongate, flexible thermally conduit strips comprise a plurality of layers of flexible graphite.

10. A head-mounted display device as recited in claim 6, wherein the plurality of flat, elongate, flexible thermally conduit strips comprise a plurality of layers of metal.

11. A head-mounted display device as recited in claim 6, further comprising a first thermally conductive bracket coupled to at least one of the electronic components and to a one of the flexible thermal conduits associated with one of the side arms.

12. A head-mounted display device as recited in claim 11, wherein the first thermally conductive bracket secures together the plurality of flat, elongate, flexible thermal conduit strips of said one of the flexible thermal conduits.

13. A head-mounted display device as recited in claim 11, further comprising a circuit board mounted to an interior surface of the visor assembly, the circuit board having at least some of the plurality of electronic components disposed thereon, wherein the first thermally conductive bracket is coupled to the circuit board.

14. A head-mounted display device as recited in claim 13, further comprising a heat spreader held to the circuit board by the first thermally conductive bracket.

15. A head-mounted display device as recited in claim 14, further comprising a clamp disposed proximate to the corresponding one of the plurality of hinges associated with said one of the side arms, wherein the clamp secures together the plurality of flat, elongate, flexible thermal conduit strips of said one of the flexible thermal conduits.

* * * * *